United States Patent
Moritz et al.

(10) Patent No.: US 11,388,798 B2
(45) Date of Patent: Jul. 12, 2022

(54) METHOD FOR OPERATING AN OPTOELECTRONIC SEMICONDUCTOR DEVICE AND OPTOELECTRONIC SEMICONDUCTOR DEVICE

(71) Applicant: OSRAM Opto Semiconductors GmbH, Regensburg (DE)

(72) Inventors: Martin Moritz, Regensburg (DE); Sebastian Stigler, Scharmassing (DE); Uli Hiller, Bad Abbach (DE); Benjamin Höflinger, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 17/264,241

(22) PCT Filed: Sep. 15, 2020

(86) PCT No.: PCT/EP2020/075722
§ 371 (c)(1),
(2) Date: Jan. 28, 2021

(87) PCT Pub. No.: WO2021/052938
PCT Pub. Date: Mar. 25, 2021

(65) Prior Publication Data
US 2021/0385918 A1    Dec. 9, 2021

(30) Foreign Application Priority Data

Sep. 19, 2019  (DE) .................... 10 2019 125 268.7

(51) Int. Cl.
*H05B 45/28*    (2020.01)
*B60Q 3/80*    (2017.01)
(Continued)

(52) U.S. Cl.
CPC .............. *H05B 45/28* (2020.01); *B60Q 3/74* (2017.02); *B60Q 3/80* (2017.02); *H01L 33/32* (2013.01); *H05B 45/18* (2020.01)

(58) Field of Classification Search
CPC .......... H05B 45/28; H05B 45/18; B60Q 3/74; B60Q 3/80; H01L 33/32
See application file for complete search history.

(56) References Cited

U.S. PATENT DOCUMENTS

2010/0259182 A1* 10/2010 Man ...................... H05B 45/22
  315/250
2013/0293114 A1* 11/2013 Tipirneni ............... H05B 45/20
  315/151
(Continued)

FOREIGN PATENT DOCUMENTS

DE  10 2007 044 556 A1  3/2009
DE  10 2012 217 534 A1  3/2014
(Continued)

*Primary Examiner* — Renan Luque
(74) *Attorney, Agent, or Firm* — Hauptman Ham, LLP (57) ABSTRACT

A method for operating an optoelectronic semiconductor device. The semiconductor device includes a first optoelectronic semiconductor chip for generating, for example, blue light, an optional second optoelectronic semiconductor chip for generating, for example, green light, and a third optoelectronic semiconductor chip for generating, for example, red light. The semiconductor device also includes a driver unit which supplies the semiconductor chips with current during operation. The third semiconductor chip is operated on the basis of a temperature-brightness characteristic curve stored in the driver unit. The temperature-brightness characteristic curve is configured for a minimum color location deviation over an intended operating temperature range, relative to at least one reference color location.

17 Claims, 4 Drawing Sheets

(51) Int. Cl.
   *B60Q 3/74*    (2017.01)
   *H05B 45/18*   (2020.01)
   *H01L 33/32*   (2010.01)

(56) References Cited

U.S. PATENT DOCUMENTS

2017/0278829 A1* 9/2017 Stoll .................... H01L 33/507
2019/0191516 A1* 6/2019 Li ........................... F21K 9/232

FOREIGN PATENT DOCUMENTS

| | | |
|---|---|---|
| DE | 10 2016 207 729 A1 | 11/2017 |
| WO | 2007/090283 A1 | 8/2007 |
| WO | 2009/034060 A1 | 3/2009 |
| WO | 2017/153026 A1 | 9/2017 |

* cited by examiner

METHOD FOR OPERATING AN OPTOELECTRONIC SEMICONDUCTOR DEVICE AND OPTOELECTRONIC SEMICONDUCTOR DEVICE

CROSS REFERENCE TO RELATED APPLICATION

This application is a National Stage of International Application No. PCT/EP2020/075722, filed on Sep. 15, 2020, which designates the United States and was published in Europe, and which claims priority to German Patent Application No. 10 2019 125 268.7, filed on Sep. 19, 2019, in the German Patent Office. Both of the aforementioned applications are hereby incorporated by reference in their entireties.

A method for operating an optoelectronic semiconductor device is specified. Furthermore, an optoelectronic semiconductor device is specified.

A task to be solved is to specify a method by which a color location of an emission of an optoelectronic semiconductor device can be precisely controlled at different temperatures.

This task is solved inter alia by a method and by a semiconductor device comprising the features of the independent patent claims. Preferred further developments are the subject of the dependent claims.

According to at least one embodiment, the method is used to operate an optoelectronic semiconductor device. The semiconductor device is in particular a light source based on light-emitting diode chips and/or on laser diode chips. In intended operation, the semiconductor device emits colored or white light with an adjustable color and/or correlated color temperature.

According to at least one embodiment, the semiconductor device comprises one or more first optoelectronic semiconductor chips. The at least one first semiconductor chip is configured to generate light of a first color, preferably blue light. Furthermore, the semiconductor device optionally comprises one or more second optoelectronic semiconductor chips. In particular, the at least one second optoelectronic semiconductor chip is configured to generate green light. Finally, the semiconductor device comprises one or more third optoelectronic semiconductor chips. The at least one third semiconductor chip is configured to generate light of a third color different from the first color, which is preferably red light.

The at least one first semiconductor chip, the optional at least one second semiconductor chip, and the at least one third semiconductor chip may be the only optoelectronic semiconductor chips of the semiconductor device. Alternatively, one or more further semiconductor chips may be provided which exhibit a different colored emission, for example a cyan colored emission and/or a yellow emission and/or a warm white or cool white emission. All optoelectronic semiconductor chips of the semiconductor device are preferably light emitting diode chips, in short LED chips.

According to at least one embodiment, the semiconductor device comprises one or more driver units, preferably exactly one driver unit. The driver unit is in particular a current source for the first, second and third semiconductor chips. That is, by means of the driver unit, the semiconductor chips are supplied with current during intended operation.

The current is applied in particular by means of pulse width modulation, or PWM for short, so that a fixed, constant or approximately constant current flows through the semiconductor chips in predefinable time blocks. An average current intensity for the semiconductor chips can thus be specified by a time fraction during which the semiconductor chips are operated. The emission color can be adjusted via corresponding time fractions for the different semiconductor chips. As an alternative to PWM control, the semiconductor chips can be operated continuously, wherein the current intensity is varied.

According to at least one embodiment, the at least one third semiconductor chip, which is particularly preferably provided for the emission of red light, is operated on the basis of a temperature-brightness characteristic curve stored in the driver unit. The temperature-brightness characteristic curve is preferably stored in a fixed manner in the driver unit and is stored in an unchangeable manner.

According to at least one embodiment, the temperature-brightness characteristic curve is configured for a minimum color location deviation over an intended operating temperature range. The color location deviation is taken with respect to one or more reference color locations.

With regard to the designations color location or chromaticity points, reference is made below in each case to the CIE-xy standard chromaticity diagram of 1931.

In at least one embodiment, the method is for operating an optoelectronic semiconductor device, wherein the semiconductor device comprises a first optoelectronic semiconductor chip for generating preferably blue light, optionally a second optoelectronic semiconductor chip for generating green light, and a third optoelectronic semiconductor chip for generating preferably red light. Further, the semiconductor device comprises a driver unit that supplies the semiconductor chips with current during operation. The third semiconductor chip is operated based on a temperature-brightness characteristic curve stored in the driver unit, wherein the temperature-brightness characteristic curve is configured for a minimum color location deviation over an intended operating temperature range with respect to at least one reference color location.

RGB LEDs, also referred to as multi-LEDs, such as the semiconductor device described herein, comprise at least three types of LED chips for emitting red, green, and blue light. The LED chips are driven by an external or internal driver IC integrated in the semiconductor device. Mixed colors can be set within the color space defined by the LED chips. The types of LED chips are preferably based on different chip technologies. In particular, the red emitting LED chip is based on the InGaAlP material system and the green and blue emitting LED chips are based on the InGaN material system.

Thus, the types of LED chips comprise different electro-optical temperature range characteristics. This leads to the fact that a set color also changes due to changing temperatures of an active zone of the LED chips.

Due to the technology, the temperature dependence of the brightness of the red emitting LED chip based on InGaAlP is much more pronounced than that of the green and blue emitting LED chips based on AlInGaN. As a result, the contribution of red light in the mixed color decreases more at higher temperatures, causing the resulting mixed color to deviate from the target color location.

The optoelectronic semiconductor device described here, which is designed in particular as an RGB LED, preferably comprises an ASIC as the driver unit, wherein ASIC stands for application-specific integrated circuit. This ASIC, also referred to as µdriver, preferably comprises a temperature sensor that detects the temperature of the LED chips. Furthermore, the driver unit preferably has two, three or more than three current outputs provided for the red, green and blue emitting semiconductor chip. The driver unit may be integrated in a package of the optoelectronic semiconductor device and/or in a package of the LED chips. Current modulation is preferably performed by means of pulse width modulation, also referred to as PWM for short. For this purpose, the temperature-brightness characteristic curve is stored in the driver unit, which specifies pulse widths for the operation of the preferably red-emitting third semiconductor chip as a function of the detected temperature.

In this context, characteristic curves, in particular linear characteristic curves, are usually selected so that the brightness of the red-emitting LED chip remains largely constant within a specified temperature range. However, this leads to the fact that significant color location shifts can occur with temperature changes.

In the method described here, however, an improvement in the color stability of the semiconductor device, which is preferably designed as an RGB LED, is achieved by a special mode of operation of the system comprising LED components, temperature sensor and driver unit. Here, the control of the current pulse widths at a driver output for the red-emitting, third semiconductor chip is carried out with a special temperature-brightness characteristic curve.

In the method described here, the temperature-brightness characteristic curve is determined in such a way that the smallest possible color difference from a mixed color selected as an adjustment point or reference color location occurs when the temperature changes. This procedure makes it possible to achieve significantly higher color stability not only at the adjustment point, but also for all mixed colors in the temperature range under consideration.

Thus, by using a method described here with a special temperature-brightness characteristic curve for controlling the mixed colors, a significantly higher color stability over temperature is achieved than by exclusively compensating the contribution of the brightness of the red-emitting semiconductor chip. As a result, an improvement can be achieved in terms of color location stability without increasing the number of channels controlled via temperature. Multiple adjustment points or reference color locations can also be selected.

The temperature-brightness characteristic curve described here is thus determined in particular in such a way that a minimum color location change occurs with respect to all adjustment points in the event of temperature changes.

According to at least one embodiment, the intended operating temperature range extends from 0° C. or less to 100° C. or more. In particular, the operating temperature range covers at least the temperature range of from −20° C. to 110° C. or from −40° C. to 125° C., preferably in each case with respect to a temperature of the third semiconductor chip, specifically a temperature of an active zone of the third semiconductor chip in which charge carrier recombination for radiation generation takes place.

According to at least one embodiment, the reference color location, also referred to as the adjustment point, or at least one of the reference color locations, or all of the reference color locations, is located in the CIE-xy standard chromaticity diagram at coordinates 0.31; 0.33 with a tolerance of at most 0.1 units or 0.05 units. That is, the reference color location or at least one of the reference color locations may lie in the white region or near the white region of the standard chromaticity diagram. Alternatively or additionally, the reference color location or one of the reference color locations or all of the reference color location lie in the orange range, in particular at a color location with coordinates 0.63; 0.31, with a tolerance of at most 0.05 units or 0.02 units. The tolerances describe in each case a circle with the respective numerical value as radius around the respective specified color location.

If several reference color locations are present, preferably at least one of the reference color locations is located outside the range defined above. That is, at least one of the reference color locations may represent colored light and/or non-orange light.

According to at least one embodiment, exactly one reference color location is present, with respect to which the temperature-brightness characteristic curve is configured for a minimum color location deviation. This reference color location is preferably located in the CIE-xy standard chromaticity diagram at a distance from a color location of an emission of the third semiconductor chip of at least 0.1 units or 0.2 units, with respect to a temperature of 25° C. That is, the reference color location may be far away from a color location of the red light of the third semiconductor chip.

According to at least one embodiment, the temperature-brightness characteristic curve for the third semiconductor chip is configured for a minimum color location deviation to several, for example to two or to three or to more than three, different reference color locations. Thereby, the reference color locations are located in the CIE-xy standard chromaticity diagram preferably in pairwise at a distance from each other of at least 0.05 units or 0.1 units. This makes it possible by means of the reference color locations to achieve accurate color reproduction over a wide color location range by means of the semiconductor device.

According to at least one embodiment, the reference color locations are weighted differently when determining the temperature-brightness characteristic curve. Alternatively, the reference color locations may be equally weighted. Equally weighted means that each distance to each reference color location enters with a factor of 1, relative to each other, when minimizing the color location deviation. Differentially weighted means that, for example, one of the distances to a particular reference color location is weighted by a factor not equal to 1, for example by a factor of 2, to give the corresponding reference color location double weighting. This means that a particularly high color location accuracy can be achieved in a particular color location range in which the higher weighted reference color location is located.

According to at least one embodiment, the semiconductor device is free of phosphors. That is, the individual semiconductor chips generate the light to be emitted directly via charge carrier recombination in a semiconductor layer sequence, and not by means of phosphors such as YAG:Ce. Alternatively, although the first, second, and third semiconductor chips are free of phosphor, there is another semiconductor chip that comprises a phosphor and, in particular, generates white light.

According to at least one embodiment, determining the temperature-brightness characteristic curve for the third semiconductor chip to emit red light comprises the following steps:

Optionally, a constant target brightness is first specified for the at least one reference color location. The target brightness is specified in particular in lumens, lm, or in candela, cd, preferably in lumens.

A brightness and/or a current for the third semiconductor chip is determined for each temperature sampling point of a plurality of temperature sampling points, so that the respective reference color location is hit as accurately as possible. To determine the respective current and/or the respective brightness, it is assumed in particular that the brightness of the first and second semiconductor chips are independent of temperature. The temperature sampling points comprise, for example, step widths of 5° C. or 10° C. or 20° C.

Finally, interpolation is carried out between the temperature sampling points to obtain the temperature-brightness characteristic curve. The interpolation is carried out, for example, by means of a spline fit.

The temperature-brightness characteristic curve may be obtained computationally or experimentally.

According to at least one embodiment, the first and second semiconductor chip are operated independently of temperature. That is, a brightness and/or a current intensity of the first and the second semiconductor chip is constant over the operating temperature range, in particular with respect to a certain initial temperature, for example 25° C. Thus, it is sufficient to store a single temperature-dependent characteristic curve in the driver unit, namely the temperature-brightness characteristic curve for the third semiconductor chip. Thus a comparatively simple control with only one single temperature-dependent characteristic curve is possible, wherein nevertheless a high precision is attainable regarding the adjustable color location.

According to at least one embodiment, the temperature-brightness characteristic curve for the third semiconductor chip drops less steeply towards higher temperatures than a standard characteristic curve. The standard characteristic curve is designed for a constant brightness of the said semiconductor chip over the operating temperature range. Such standard characteristic curves are generally linear or approximately linear.

According to at least one embodiment, the temperature-brightness characteristic curve for the third semiconductor chip is non-linear. That is, the temperature-brightness characteristic curve deviates significantly from a linear curve. This is especially true in a linear plot of temperature versus a linear plot of brightness.

According to at least one embodiment, the temperature-brightness characteristic curve comprises a smaller slope than the standard characteristic curve at any temperature in the operating temperature range. In other words, the temperature-brightness characteristic curve is consistently flatter than the standard characteristic curve.

According to at least one embodiment, the temperature-brightness characteristic curve slopes increasingly more steeply toward higher temperatures. That is, a change in slope of the temperature-brightness characteristic curve decreases toward higher temperatures, so that a first derivative of the temperature-brightness characteristic curve may tend towards zero when approaching higher temperatures.

The aforementioned relations between the temperature-brightness characteristic curve and the standard characteristic curve apply in particular if these two characteristic curves are normalized to each other at a temperature of 25° C., i.e. intersect at a temperature of 25° C.

According to at least one embodiment, the semiconductor chips are mounted on a common carrier. The common carrier is, for example, a printed circuit board or a leadframe with several leadframe parts. Preferably, the driver unit is also mounted on the common carrier.

According to at least one embodiment, the driver unit is an ASIC. Preferably, the driver unit comprises the temperature sensor or at least one of the temperature sensors or all of the temperature sensors.

According to at least one embodiment, the first and the second semiconductor chip are each based on the material system AlInGaN or InGaN. An emission color is set in particular via the indium content, so that the second semiconductor chip may comprise a higher indium content than the first semiconductor chip. In contrast, the third semiconductor chip is based on the AlInGaP material system.

AlInGaN is a shorthand notation for a semiconductor layer sequence with multiple layers, preferably each consisting of $Al_n In_{1-n-m} Ga_m N$, and correspondingly for AlInGaP consisting of $Al_n In_{1-n-m} Ga_m P$, wherein 0 n 1, $0 \leq m \leq 1$ and $n+m \leq 1$, respectively. Preferably, for at least one layer or for all layers of the semiconductor layer sequence, $0 < n \leq 0.8$ and $0.4 \leq m < 1$. In this context, the semiconductor layer sequence may comprise dopants as well as additional components. For simplicity, however, only the essential constituents of the crystal lattice of the semiconductor layer sequence, i.e., Al, Ga, In, N, or P, are specified, even if these may be partially replaced and/or supplemented by small amounts of additional substances.

According to at least one embodiment, each emissions of the semiconductor chips comprises a color saturation of at least 0.8 or 0.9 or 0.95. That is, the color locations of the light emitted by the respective semiconductor chips are close to the spectral color line of the CIE-xy standard chromaticity diagram.

According to at least one embodiment, the first semiconductor chip emits light with a dominant wavelength of at least 445 nm or 455 nm or 460 nm and/or of at most 485 nm or 475 nm or 470 nm. In particular, the dominant wavelength of the first semiconductor chip is 465 nm+/−2.5 nm.

According to at least one embodiment, the second semiconductor chip comprises a dominant emission wavelength of at least 505 nm or 515 nm or 520 nm. Alternatively, or at least, the dominant emission wavelength of the second semiconductor chip is at most 545 nm or 535 nm or 531 nm. In particular, the dominant emission wavelength of the second semiconductor chip is 527 nm+/−3 nm.

According to at least one embodiment, the third semiconductor chip emits light of a dominant wavelength of at least 600 nm or 610 nm or 615 nm and/or of at most 640 nm or 630 nm or 625 nm at a temperature of an active zone of 23° C. In particular, the dominant wavelength of the light of the third semiconductor chip is 619 nm+/−2.5 nm, especially at a temperature of 23° C.

Furthermore, an optoelectronic semiconductor device is specified. The semiconductor device is preferably operated by a method as described in connection with one or more of the above embodiments. Features of the method are therefore also disclosed for the optoelectronic semiconductor device, and vice versa.

In at least one embodiment, the optoelectronic semiconductor device comprises a first optoelectronic semiconductor chip for generating preferably blue light, an optional second optoelectronic semiconductor chip for generating green light, and a third optoelectronic semiconductor chip for generating preferably red light, as well as a driver unit that independently operates the semiconductor chips during operation. The semiconductor chips as well as the driver unit are mounted on a carrier, which is preferably formed as a heat sink. The driver unit is configured to operate the third semiconductor chip based on a temperature-brightness characteristic curve stored in the driver unit, wherein the temperature-brightness characteristic curve is configured for a minimum color location deviation over an intended operating temperature range with respect to one or more reference color locations.

According to at least one embodiment, the optoelectronic semiconductor device is configured for a vehicle lighting system such as a vehicle interior lighting system, in particular for a car interior lighting system. In this case the semiconductor device comprises an adjustable emission color. In addition to a car, the vehicle may also be an airplane or a ship, or a truck. In this respect, the semiconductor device preferably complies with the required safety regulations, in particular concerning fire protection and/or radio interference suppression.

Furthermore, a vehicle is specified which comprises one or more of the semiconductor devices described above. Features of the method as well as of the semiconductor device are therefore also disclosed for the vehicle and vice versa.

In the following, a method described herein, an optoelectronic semiconductor device described herein, and a vehicle described herein are explained in more detail with reference to the drawing by means of exemplary embodiments.

Identical reference signs thereby specify identical elements in the individual figures. However, no references true to scale are shown; rather, individual elements may be shown exaggeratedly large for better understanding.

Figure 1:
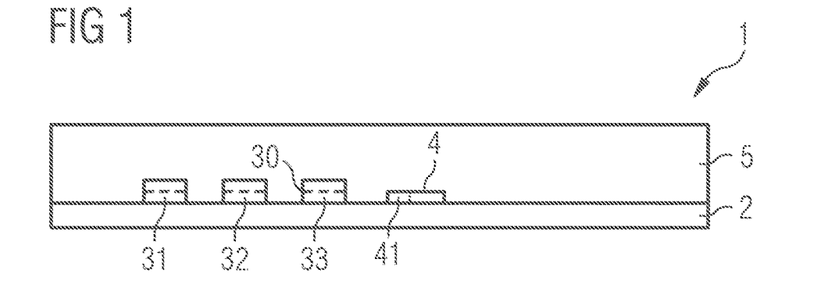
FIGS. 1 and 2 show schematic sectional views of exemplary embodiments of optoelectronic semiconductor devices described herein.

FIG. 1 shows an exemplary embodiment of an optoelectronic semiconductor device 1. The semiconductor device 1 comprises a carrier 2. The carrier 2 is, for example, a circuit board in which undrawn heat sinks may be integrated or which is a heat sink, or a leadframe with an undrawn division into several leadframe parts. Any electrical bonding agents such as solder joints and/or bonding wires as well as conductor tracks are not drawn to simplify the illustration.

A first optoelectronic semiconductor chip 31 for generating blue light, a second optoelectronic semiconductor chip 32 for generating green light and a third optoelectronic semiconductor chip 33 for generating red light are located on the carrier 2. Semiconductor layer sequences of semiconductor chips 31, 32, 33 each comprise an active zone 30 in which the respective radiation is generated.

The semiconductor chips 31, 32, 33 are preferably each light-emitting diode chips. According to the sectional view of FIG. 1, the semiconductor chips 31, 32, 33 are arranged linearly. Seen in plan view of the carrier 2, triangular arranging of the semiconductor chips 31, 32, 33 can also be present.

In addition, a driver unit 4 is provided on the carrier 2. The driver unit 4 comprises current outputs for the semiconductor chips 31, 32, 33 that are not specifically drawn. That is, the semiconductor chips 31, 32, 33 are electrically controllable individually and independently of each other via the driver unit 4 during operation of the semiconductor device 1, so that the semiconductor device 1 can emit a variable mixed color. In particular, the driver unit 4 comprises a temperature sensor 41. The driver unit 4 preferably is an ASIC.

Deviating from the illustration of FIG. 1, it is alternatively possible that the driver unit 4 itself forms the carrier 2, so that the semiconductor chips 31, 32, 33 are then mounted on the driver unit 4 as the carrier 2. This is also possible in all other exemplary embodiments.

Optionally, the semiconductor chips 31, 32, 33 as well as the driver unit 4 are located in a housing 5 which is mounted above the carrier 2. For example, the housing 5 is a light-transmitting, light-diffusing encapsulant 5 that protects the semiconductor chips 31, 32, 33 from external environmental influences.

The carrier 2 preferably comprises electrical connection pads for external electrical contacting on a bottom side facing away from the semiconductor chips 31, 32, 33. Such connection pads are not illustrated for simplicity of presentation.

Figure 2:
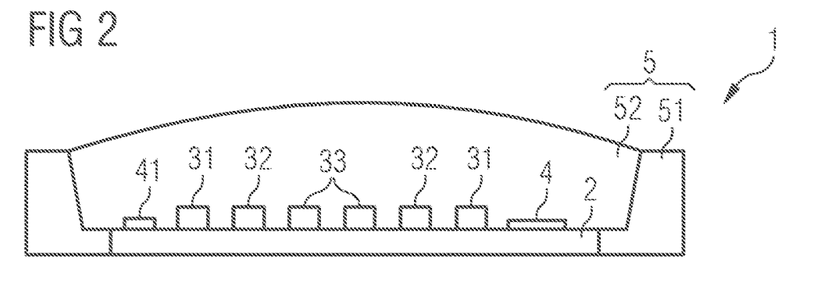

FIG. 2 shows a further exemplary embodiment of the semiconductor device 1. Different from FIG. 1, there are respectively a plurality of first semiconductor chips 31, a plurality of second semiconductor chips 32 and a plurality of third semiconductor chips 33. In contrast to FIG. 2, the semiconductor chips 31, 32, 33 are preferably not arranged linearly as seen in a top view of the carrier 2, but are arranged in a triangular or hexagonal arrangement, for example, in order to achieve improved light mixing.

As in all exemplary embodiments, it is possible that a separate temperature sensor 41 is present which is not integrated in the driver unit 4. Furthermore, the housing 5 optionally comprises a housing base body 51 which is formed, for example, as a reflective potting body and which can surround and border the carrier 2 all around. As a further option, the housing 5 comprises a filling 52, for example a transparent or light-diffusing potting.

Figure 3:
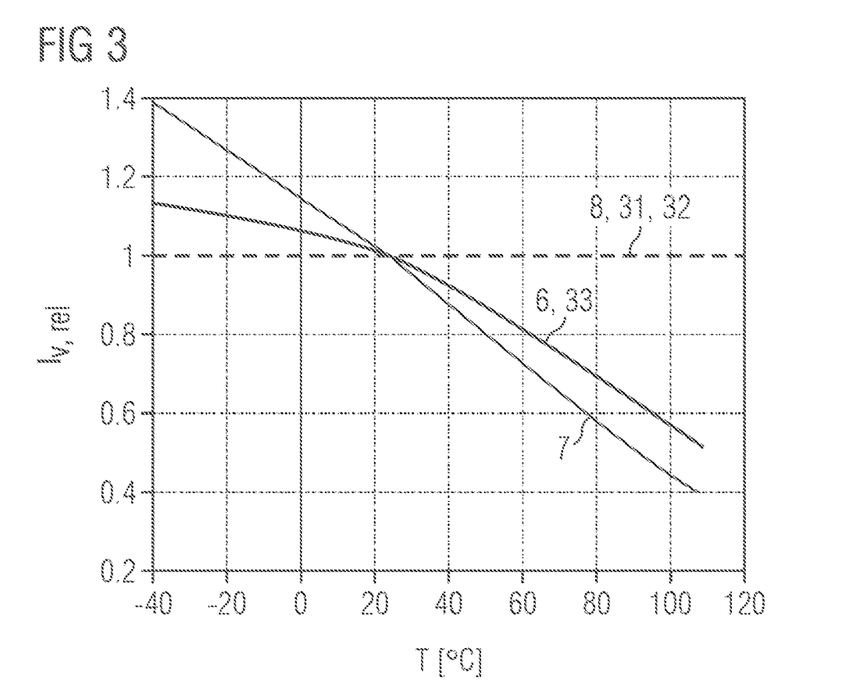
FIG. 3 shows a schematic representation of a temperature-brightness characteristic curve of an exemplary embodiment of optoelectronic semiconductor devices described herein.

FIG. 3 shows characteristic curves for a brightness-temperature dependence. The temperature T is plotted linearly in ° C. against a relative brightness $I_{v,rel}$.

FIG. 3 shows a conventional standard characteristic curve 7 for comparison. The standard characteristic curve 7 is approximately linear. The standard characteristic curve 7 applies to a red-emitting LED chip based on the AlGaInP material system. For the standard characteristic curve 7, the brightness $I_{v,rel}$ is set so that the brightness, in particular in lumens, is constant over temperature. That is, according to standard characteristic curve 7, an LED chip in the red spectral region emits light of the same brightness regardless of temperature.

In contrast, the temperature-brightness characteristic curve 6 used for optoelectronic semiconductor devices 1 described herein comprises a different characteristic for the third semiconductor chip 33. The temperature-brightness characteristic curve 6 has a flatter overall shape than the standard characteristic curve 7. A slope of the temperature-brightness characteristic curve 6 increases toward high temperatures T, wherein a slope change of the temperature-brightness characteristic curve 6 decreases toward higher temperatures T. The characteristic curves 6, 7 intersect at 25° C.

The temperature-brightness characteristic curve 6, unlike the standard characteristic curve 7, is not optimized to maintain a constant brightness of an emission from the third semiconductor chip 33, but to minimize a change in color location. This is explained in more detail below in connection with FIGS. 4 and 7.

In addition, exemplary temperature-independent characteristic curves 8 for the first and second semiconductor chips 31, 32 are shown in FIG. 3 as a dash line. This means that with regard to the semiconductor chips 31, 32 there is preferably no dedicated, temperature-dependent control. In the semiconductor device 1 described here, temperature-dependent control is thus particularly preferably provided only for the third semiconductor chip 33, and specifically in accordance with the temperature-brightness characteristic curve 6.

Figure 4:
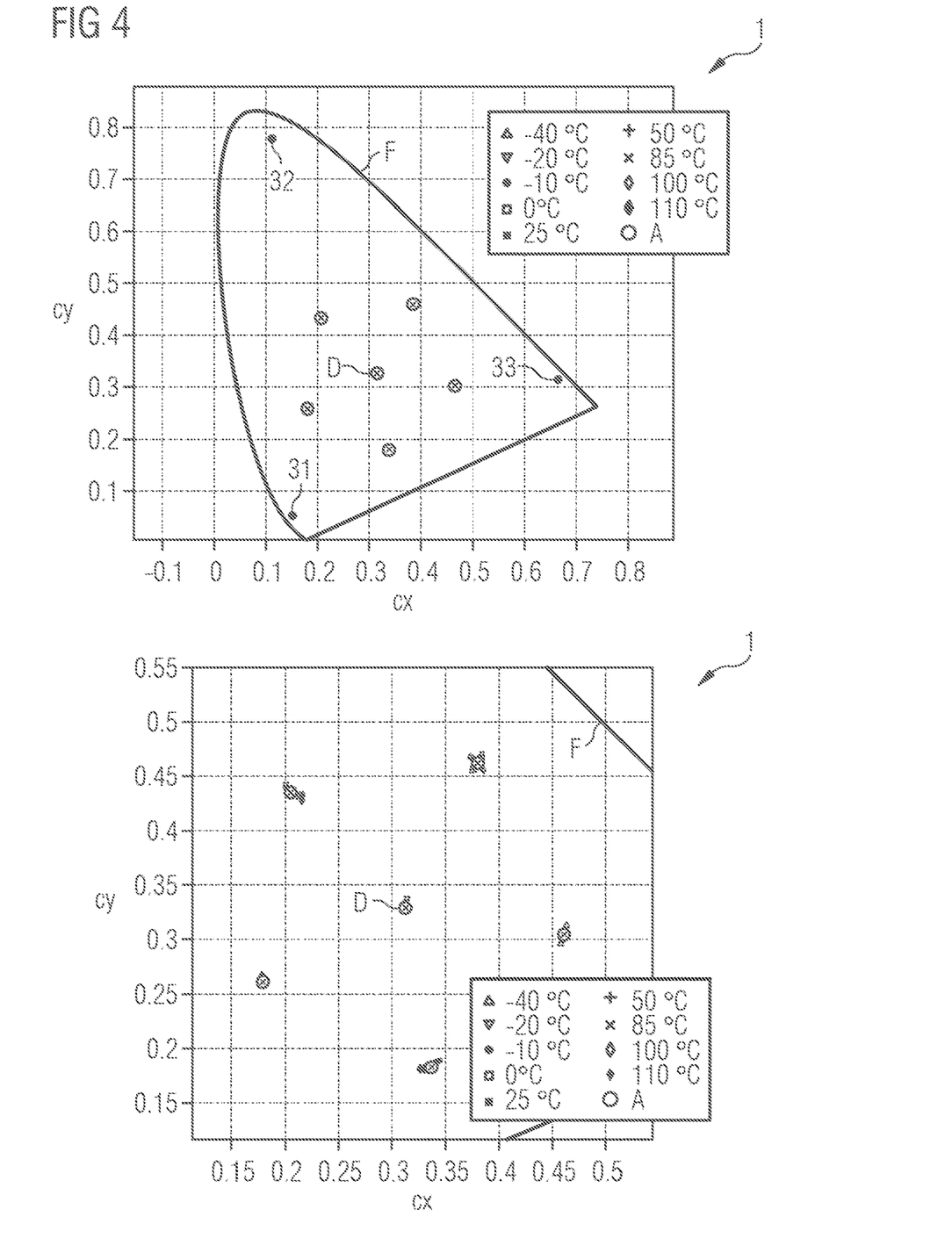
FIG. 4 shows a schematic diagram illustrating a color location accuracy using the CIE-xy diagram for an optoelectronic semiconductor device described herein.

FIG. 4, upper part of the figure, shows the CIE-xy standard chromaticity diagram. FIG. 4, lower part of the figure, shows a section of the upper part of the figure. Exemplary color locations of the emissions of the semiconductor chips 31, 32, 33, in particular at 25° C., are shown. The respective color locations are close to the spectral color line F of the color diagram.

Furthermore, a total of six target color locations A are plotted, which lie in and around the white region in the standard chromaticity diagram. The drawn target color locations A, symbolized by circles, are reached at a temperature of 25° C., for example. A centrally located target color location A is at the same time a reference color location D, with respect to which an optimization and shaping of the temperature-brightness characteristic curve 6 from FIG. 3 takes place.

From the lower part of FIG. 4 it can be seen that in particular at the reference color location D for different temperatures of an active zone of the third semiconductor chip 33 hardly any color location deviations occur. Although it was only optimized with respect to the reference color location D, a color location deviation, depending on the temperature, is also comparatively small for the surrounding target color locations A.

Thus, a high target color location accuracy as a function of temperature can be achieved with the method described here.

Figure 5:
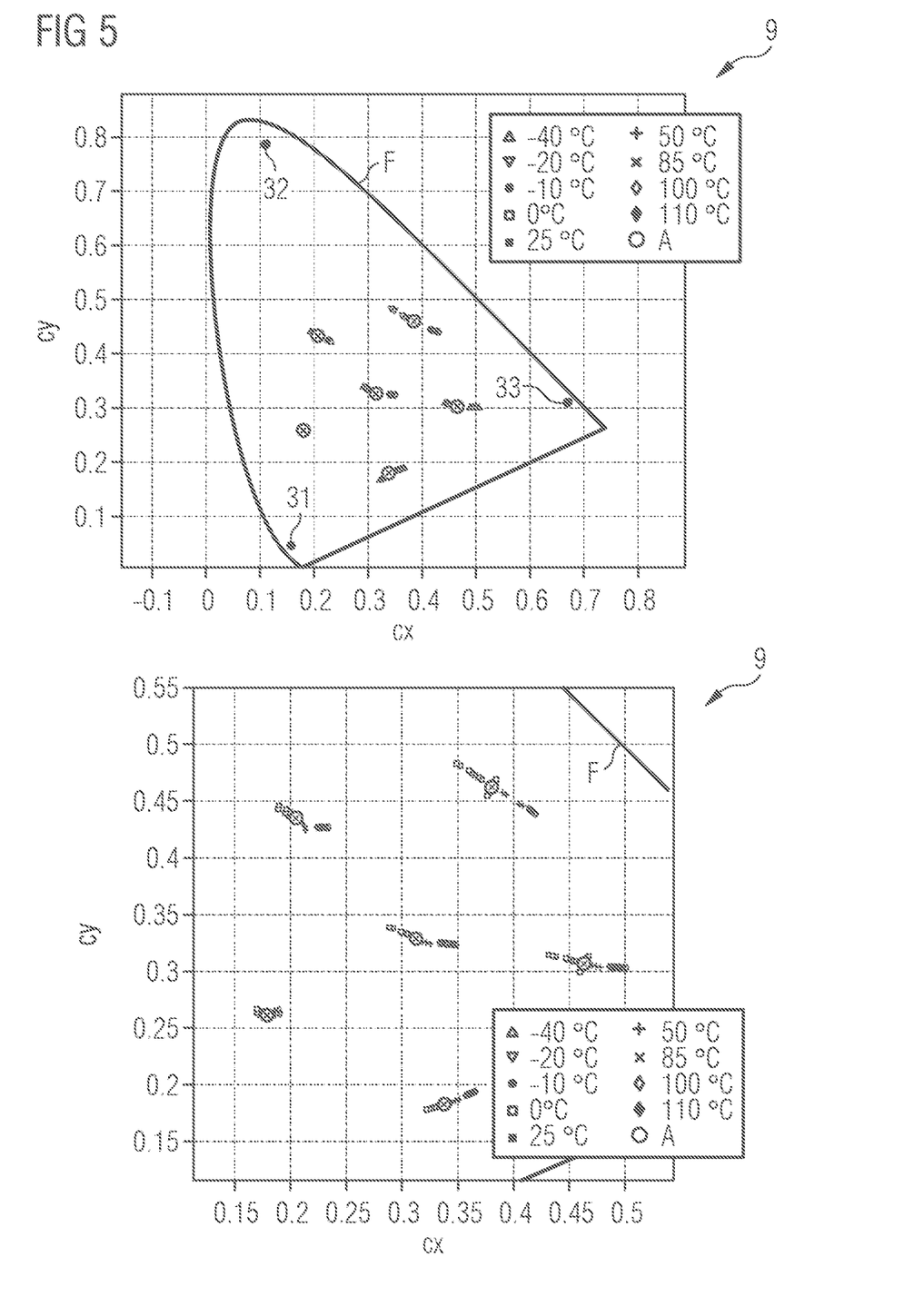
FIG. 5 shows a schematic illustration of color reproduction characteristics using a CIE-xy diagram for a modification of a semiconductor device.

FIG. 5 shows a representation corresponding to FIG. 4, but for a modification 9 of a semiconductor device. That is, for a temperature stabilization of the third semiconductor chip 33, which emits in the red spectral range, no use was made of the special temperature-brightness characteristic curve 6 described here, but of a standard characteristic curve 7, as shown in FIG. 3, which aims at a constant emission brightness of the third semiconductor chip 33.

In particular, from FIG. 5, lower part of the figure, it can be seen that significant deviations from the target color locations A occur depending on the temperature. The deviations from the target color locations A are more pronounced by about a factor of 10 according to FIG. 5 than according to FIG. 4. Thus, the use of the temperature-brightness characteristic curve 6 results in a significantly better behavior with respect to color location stability against temperature changes. At the same time, a control effort can be kept relatively small, since only the third semiconductor chip 33 shows a temperature-dependent characteristic curve and the first and second semiconductor chips 31, 32 can be operated with temperature-independent characteristic curves 8.

Figure 6:
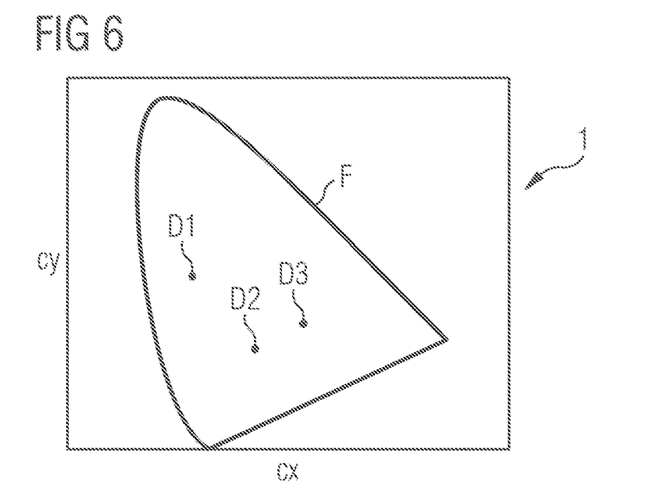
FIG. 6 shows a schematic representation of a CIE-xy diagram for an optoelectronic semiconductor device described here with several reference color locations.

FIG. 6 illustrates that not only one reference color location but several reference color locations D1, D2, D3 may be used. The reference color locations D1, D2, D3 are arranged relatively widely apart in the CIE-xy standard chromaticity diagram. For minimizing color locations deviations when determining the temperature-brightness characteristic curve 6, the reference color locations D1, D2, D3 can be equally weighted so that the differences to each of the reference color locations D1, D2, D3 are equally considered at the respective temperature and are minimized in total. Alternatively, the reference color locations D1, D2, D3 are weighted differently so that, for example, a deviation from the reference color location D2 is included twice in the sum of the color location deviations, so that the color location region around the reference color location D2 is then stabilized and optimized to a particularly high degree.

Figure 7:
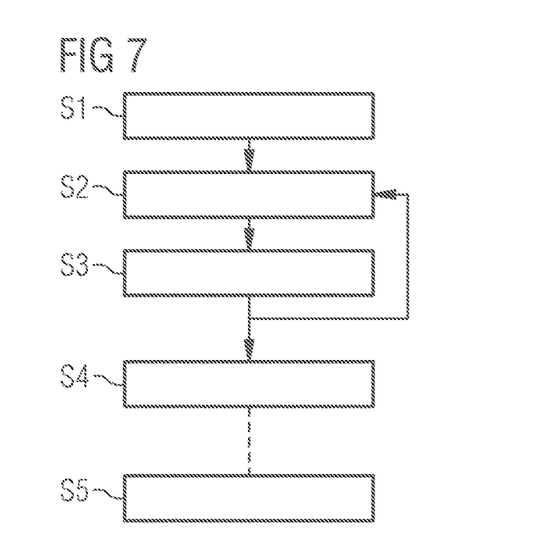
FIG. 7 shows a schematic representation of a block diagram for a method described herein for operating exemplary embodiments of optoelectronic semiconductor devices.

FIG. 7 shows a schematic block diagram of the method described here. According to the optional method step S1, the reference color location D or the reference color locations D1, D2, D3 are defined. Likewise, it is preferably defined how great the brightness at respective the reference color location has to be.

In the subsequent step S2, a definition of a temperature sampling point takes place at which the brightness and/or current intensity for the temperature-brightness characteristic curve 6 is to be determined.

In step S3, the brightness and/or current intensity for the temperature-brightness characteristic curve 6 is determined at the corresponding temperature sampling point. In this process, the current intensities and/or brightnesses for the first and second semiconductor chips 31, 32 remain unchanged, so that the current intensity and/or brightness for the third semiconductor chip 33 is varied until there is a minimum deviation from the at least one reference color location.

Steps S2 and S3 are repeated until a sufficient number of temperature sampling points have been run through and a sufficient number of values have been determined. Here, the current intensities and/or brightnesses for the first and second semiconductor chips 31, 32 are preferably used unchanged over all temperature sampling points. Subsequently, in method step S4, an interpolation is performed between the temperature sampling points so that the temperature-brightness characteristic curve 6 is produced. The interpolation is spline-based, for example.

Finally, in method step S5 the semiconductor device 1 is operated according to the determined temperature-brightness characteristic curve 6.

Instead of temperature-independent characteristic curves 8 for the first and second semiconductor chips 31, 32, corresponding temperature-dependent characteristic curves may also be used, although this is less preferred. The same applies to all other exemplary embodiments.

Figure 8:
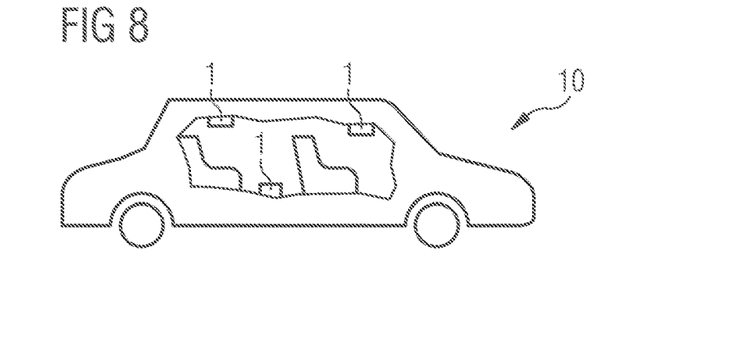
FIG. 8 shows a schematic sectional view of a vehicle with an optoelectronic semiconductor device described herein.

In FIG. 8, a vehicle 10 is schematically shown. The vehicle 10 is, for example, a car. The vehicle 10 comprises a plurality of the semiconductor devices 1, for example in a headliner of the vehicle 10 and/or in a foot area.

In particular, in the time period immediately following a start-up of the vehicle 10, comparatively low or high temperatures may be present in the vehicle headliner or the floor area of the vehicle, for example, in summer when the vehicle is exposed to strong sunlight or in winter when the vehicle is parked outdoors. With the semiconductor devices 1 described herein, it is possible for the desired emission color to be correctly generated and emitted even at relatively low and relatively high temperatures of the semiconductor devices 1.

In deviation from the embodiment of FIG. 8, it is also possible that semiconductor devices 1 are alternatively or additionally installed at the exterior of the vehicle 10 for exterior illumination.

The invention described herein is not limited by the description based on the exemplary embodiments. Rather, the invention encompasses any new feature as well as any combination of features, which particularly includes any combination of features in the patent claims, even if that feature or combination itself is not explicitly specified in the patent claims or exemplary embodiments.

REFERENCES 1 optoelectronic semiconductor device
2 carrier
30 active Zone
31 first optoelectronic semiconductor chip (blue)
32 second optoelectronic semiconductor chip (green)
33 third optoelectronic semiconductor chip (red)
4 driver unit
41 temperature sensor
5 housing
51 housing base body
52 filling
6 temperature-brightness characteristic curve
7 standard characteristic curve
8 temperature-independent characteristic curve
9 modification of a semiconductor device
10 vehicle
cx x-coordinate in the CIE-xy standard chromaticity diagram
cy y-coordinate in the CIE-xy standard chromaticity diagram
A target color location in the CIE-xy standard chromaticity diagram
D . . . reference color location in the CIE-xy standard chromaticity diagram
F spectral color line
$I_{v,rel}$ relative brightness
S . . . method step
T temperature of the third semiconductor chip in ° C.

The invention claimed is:

1. A method for operating an optoelectronic semiconductor device,
wherein
the semiconductor device comprises a first optoelectronic semiconductor chip for generating light of a first color and a third optoelectronic semiconductor chip for generating light of a third color,
the semiconductor device comprises a driver unit which supplies the semiconductor chips with current during operation,
the third semiconductor chip is operated on the basis of a temperature-brightness characteristic curve stored in the driver unit,
the temperature-brightness characteristic curve is configured for a minimum color location deviation over an intended operating temperature range with respect to at least one reference color location,
the temperature-brightness characteristic curve for the third semiconductor chip slopes less steeply towards higher temperatures than a curve designed for constant brightness over the operating temperature range, and
the semiconductor device is free of phosphors.

2. The method according to claim 1,
wherein the first semiconductor chip is configured to generate blue light and the third semiconductor chip is configured to generate red light, and the semiconductor device further comprises a second optoelectronic semiconductor chip for generating green light.

3. The method according to claim 1,
wherein the operating temperature range is from 0° C. or less to 100° C. or more with respect to a temperature of an active zone of the third semiconductor chip,
wherein the reference color location or at least one of the reference color locations is located at coordinates 0.31; 0.33 in the CIE-xy standard chromaticity diagram with a tolerance of at most 0.1 units.

4. The method according to claim 1,
wherein the temperature-brightness characteristic curve for the third semiconductor chip is configured for a minimum color location deviation to at least three different reference color locations,
wherein the reference color locations in the CIE-xy standard chromaticity diagram pairwise comprise a distance to each other of at least 0.1 units.

5. The method according to claim 4,
wherein the reference color locations are weighted differently when determining the temperature-brightness characteristic curve.

6. The method according to claim 1,
wherein in determining the temperature-brightness characteristic curve
a brightness for the third semiconductor chip is determined for each temperature sampling point, so that the respective reference color location is hit as accurately as possible, and
interpolation is carried out between the temperature sampling points in order to obtain the temperature-brightness characteristic curve.

7. The method according to claim 2,
wherein the first and the second semiconductor chip are controlled with respect to their brightness in accordance with a temperature-independent characteristic curve.

8. The method according to claim 1,
in which the temperature-brightness characteristic curve is non-linear.

9. The method according to claim 1,
wherein the temperature-brightness characteristic comprises a smaller slope at any point than the curve designed for constant brightness over the operating temperature range.

10. The method according to claim 1,
wherein the temperature-brightness characteristic curve slopes increasingly more steeply towards higher temperatures,
wherein a change in slope of the temperature-brightness characteristic curve towards higher temperatures decreases so that a first derivative of the temperature-brightness characteristic curve towards higher temperatures tends towards zero.

11. The method according to claim 1,
wherein the semiconductor chips are mounted on a common carrier,
wherein the driver unit is an application specific integrated circuit and comprises a temperature sensor.

12. The method according to claim 2,
wherein the first and second semiconductor chips are each based on the AlInGaN material system and the third semiconductor chip is based on the AlInGaP material system.

13. The method according to claim 1,
wherein dominant wavelengths of the semiconductor chips at a temperature of 25° C. are in the following ranges, wherein a color saturation of an emission of the semiconductor chips is at least 0.8 each:

first semiconductor chip, between 455 nm and 475 nm, inclusive, second semiconductor chip, between 515 nm and 535 nm inclusive, and third semiconductor chip, between 610 nm and 630 nm, inclusive.

14. The method according to claim 1, wherein the driver unit drives each semiconductor chip by pulse width modulation, and the driver unit comprises a separate current output for each of the semiconductor chips, so that an emission color of the semiconductor device is adjustable.

15. An optoelectronic semiconductor device comprising:

a first optoelectronic semiconductor chip for generating blue light, a second optoelectronic semiconductor chip for generating green light, a third optoelectronic semiconductor chip for generating red light a driver unit which supplies the semiconductor chips with current independently from each other during operation, and a carrier which is a heat sink and on which the semiconductor chips and the driver unit are mounted together, wherein the driver unit is configured to operate the third semiconductor chip based on a temperature-brightness characteristic curve stored in the driver unit, and the temperature-brightness characteristic is configured for a minimum color location deviation over an intended operating temperature range with respect to at least one reference color location, wherein the temperature-brightness characteristic curve for the third semiconductor chip slopes less steeply toward higher temperatures than a curve configured for constant brightness over the operating temperature range, and wherein the optoelectronic semiconductor device is free of phosphors.

16. The optoelectronic semiconductor device according to claim 15, which is configured for vehicle interior lighting system of a vehicle, wherein the car interior lighting system has an adjustable emission color.

17. A method for operating an optoelectronic semiconductor device, wherein the semiconductor device comprises a first optoelectronic semiconductor chip for generating light of a first color and a third optoelectronic semiconductor chip for generating light of a third color, the semiconductor device comprises a driver unit which supplies the semiconductor chips with current during operation, the third semiconductor chip is operated on the basis of a temperature-brightness characteristic curve stored in the driver unit, the temperature-brightness characteristic curve is configured for a minimum color location deviation over an intended operating temperature range with respect to at least one reference color location, the temperature-brightness characteristic curve for the third semiconductor chip slopes less steeply towards higher temperatures than a curve designed for constant brightness over the operating temperature range, the operating temperature range is from 0° C. or less to 100° C. or more with respect to a temperature of an active zone of the third semiconductor chip, and the reference color location or at least one of the reference color locations is located at coordinates 0.31; 0.33 in the CIE-xy standard chromaticity diagram with a tolerance of at most 0.1 units.

\* \* \* \* \*